(12) United States Patent
Shiroshita et al.

(10) Patent No.: US 9,984,984 B1
(45) Date of Patent: May 29, 2018

(54) SEMICONDUCTOR ELEMENT MOUNTING BOARD

(71) Applicant: KYOCERA Corporation, Kyoto-shi, Kyoto (JP)

(72) Inventors: Makoto Shiroshita, Otsu (JP); Hisayoshi Wada, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days. days.

(21) Appl. No.: 15/362,933

(22) Filed: Nov. 29, 2016

(51) Int. Cl.
*H01L 23/64* (2006.01)
*H01L 23/00* (2006.01)
*H01L 23/498* (2006.01)
*H01L 49/02* (2006.01)

(52) U.S. Cl.
CPC ...... *H01L 23/645* (2013.01); *H01L 23/49827* (2013.01); *H01L 23/49838* (2013.01); *H01L 24/16* (2013.01); *H01L 28/40* (2013.01); *H01L 2224/16157* (2013.01); *H01L 2924/1205* (2013.01)

(58) Field of Classification Search
CPC ............ H01L 23/645; H01L 23/49827; H01L 2224/16157; H01L 28/40; H01L 28/60
See application file for complete search history.

(56) References Cited

U.S. PATENT DOCUMENTS

| 9,060,446 B2 | 6/2015 | Inagaki et al. |
| 2003/0027430 A1 | 2/2003 | Stevens et al. |
| 2007/0164414 A1* | 7/2007 | Dokai .............. G06K 19/07749 257/679 |
| 2008/0211067 A1* | 9/2008 | Nakashiba .......... H01L 23/5225 257/659 |

(Continued)

FOREIGN PATENT DOCUMENTS

| JP | 4863546 B2 | 1/2012 |
| KR | 2001-0092430 A | 10/2001 |

(Continued)

OTHER PUBLICATIONS

Taiwanese Office Action with English concise explanation, Taiwan Patent Application No. 105139225, dated Jul. 5, 2017, 5 pgs.

(Continued)

*Primary Examiner* — Nathan W Ha
(74) *Attorney, Agent, or Firm* — Volpe and Koenig, P.C.

(57) ABSTRACT

A semiconductor element mounting board includes: a circuit conductor disposed on the insulating board, a plurality of semiconductor element connection pads connected to the circuit conductor, a semiconductor element mounted on a surface of the insulating board, a first capacitor and a second capacitor disposed on a surface or an inside of the insulating board, and a first conductor path configured to connect the first capacitor between the semiconductor element connection pads, and a second conductor path configured to connect the second capacitor between the semiconductor element connection pads; and an inductance of the first conductor path is smaller than an inductance of the second conductor path, and capacitance of the first capacitor is smaller than capacitance of the second capacitor, and an internal inductance of the first capacitor is smaller than an internal inductance of the second capacitor.

2 Claims, 1 Drawing Sheet

(56) References Cited

U.S. PATENT DOCUMENTS

| | | | |
|---|---|---|---|
| 2011/0062549 A1* | 3/2011 | Lin | H01L 23/3128 257/531 |
| 2012/0236519 A1* | 9/2012 | Chen | H05K 1/181 361/752 |
| 2013/0049730 A1* | 2/2013 | Kato | H01L 23/642 323/355 |
| 2015/0171157 A1* | 6/2015 | Sturcken | H01L 23/5223 257/531 |
| 2015/0171934 A1* | 6/2015 | Brauchler | H01L 29/7393 455/41.1 |
| 2015/0244410 A1* | 8/2015 | Leong | H01L 21/76898 455/73 |
| 2015/0279828 A1 | 10/2015 | Koopmans et al. | |
| 2016/0141270 A1 | 5/2016 | Koopmans et al. | |
| 2016/0233292 A1* | 8/2016 | Chen | H01L 28/10 |

FOREIGN PATENT DOCUMENTS

| | | |
|---|---|---|
| TW | 523556 B | 3/2003 |
| TW | I553785 B | 10/2016 |

OTHER PUBLICATIONS

Korean Office Action with English concise explanation, Korean Patent Application No. 2016-160262, dated Dec. 11, 2017, 6 pgs.

* cited by examiner

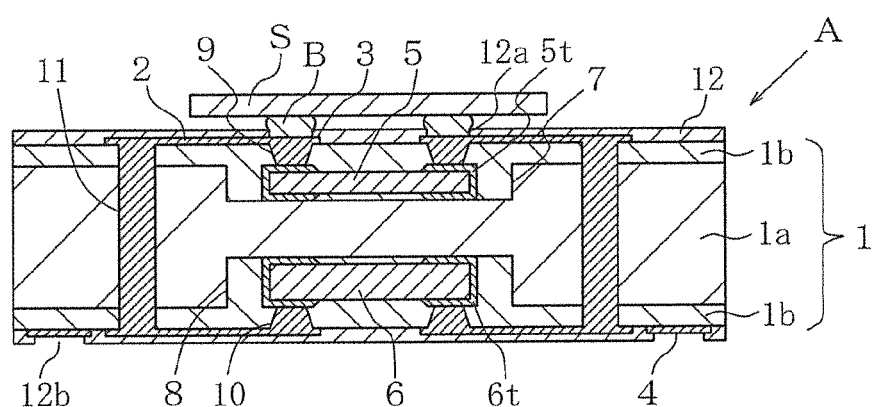

SEMICONDUCTOR ELEMENT MOUNTING BOARD

BACKGROUND OF THE INVENTION

1. Technical Field

The present disclosure relates to a semiconductor element mounting board including a plurality of capacitors.

2. Background

In recent years, amid advances in higher-functionality and miniaturization of electronic apparatuses typified by portable game machines and communication apparatuses, higher-functionality and miniaturization have been requested also in semiconductor element mounting boards to be used in these. For this reason, there is a need to provide stable supply of a lot of current in a limited space to a semiconductor element with increased amount of arithmetic processing.

In order to meet these requests, there is a semiconductor element mounting board with a plurality of built-in capacitors directly under the semiconductor element. This board with built-in capacitors is disclosed, for example, in Japanese Patent No. 4863546.

SUMMARY

An object of the present disclosure is to provide a semiconductor element mounting board capable of stably operating an electronic apparatus by reduction in the value of the impedance possessed by the board and reduction in the current fluctuation.

A semiconductor element mounting board according to an embodiment of the present disclosure includes: an insulating board including a laminated structure where a plurality of insulating layers are laminated, a circuit conductor disposed on a surface and an inside of the insulating board, a plurality of semiconductor element connection pads disposed on a surface of the insulating board and connected to a part of the circuit conductor, a semiconductor element mounted on a surface of the insulating board through the semiconductor element connection pads, a first capacitor and a second capacitor disposed on a surface or an inside of the insulating board, and a first conductor path including a part of the circuit conductor, configured to electrically connect the first capacitor between the predetermined semiconductor element connection pads, and a second conductor path including a part of the circuit conductor, configured to electrically connect the second capacitor between the predetermined semiconductor element connection pads; and is characterized in that an inductance of the first conductor path is smaller than an inductance of the second conductor path, and is characterized in that capacitance of the first capacitor is smaller than capacitance of the second capacitor, and is characterized in that an internal inductance of the first capacitor is smaller than an internal inductance of the second capacitor.

BRIEF DESCRIPTION OF THE DRAWINGS

FIG. 1 is a schematic sectional view showing an example of an embodiment of a semiconductor element mounting board of the present disclosure.

DETAILED DESCRIPTION

First, an example of a semiconductor element mounting board A of the present disclosure will be described with reference to FIG. 1.

The wiring board A includes an insulating board 1, a circuit conductor 2, a semiconductor element connection pad 3, an external connection pad 4, a semiconductor element S, a first capacitor 5, and a second capacitor 6.

This semiconductor element mounting board A includes an insulating board 1 formed by the insulating layers 1b for the build-up being laminated on the upper and lower surfaces of the insulating layer 1a for the core, a circuit conductor 2 disposed on the surface and the inside of the insulating board 1, a plurality of semiconductor element connection pads 3 disposed on the insulating board 1 surface and connected to a part of the circuit conductor 2, a semiconductor element S mounted on the surface of the insulating board 1 through the semiconductor element connection pads 3, and a first capacitor 5 and a second capacitor 6 built into the insulating board 1.

The first capacitor 5 is built into the upper side of the insulating board 1 on the side where the semiconductor element S is mounted, and is electrically connected between predetermined semiconductor element connection pads 3 by the first conductor path formed from a part of the circuit conductor 2.

The second capacitor 6 is built into the lower side of the first capacitor 5 in the insulating board 1, and is electrically connected between the predetermined semiconductor element connection pads 3 by the second conductor path formed from a part of the circuit conductor 2, with a length longer than the first conductor path length.

Thus, connecting the first and second capacitors 5 and 6 that are built into the insulating board 1 directly under the semiconductor element S to the semiconductor element S in parallel respectively through the first and second conductor paths takes the structure of supplying a lot of current to the semiconductor element S.

In order to stably supply a current to the semiconductor element S, it is important to reduce the impedance value of the conductor paths as a whole by making the sum of the capacitance of the first capacitor 5 and the capacitance of the second capacitor 6 sufficiently large, and making at least one of the sum of the internal inductance of the first capacitor 5 and the inductance of the first conductor path and the sum of the internal inductance of the second capacitor 6 and the inductance of the second conductor path as small as possible.

The insulating board 1 is formed by the insulating layers 1b for the build-up being laminated on the upper and lower surfaces of the insulating layer 1a for the core.

Each of the insulating layers 1a and 1b includes thermosetting resins such as an epoxy resin and a bismaleimide triazine resin.

In the central portion of the upper surface of the insulating layer 1a for the core, a recess 7 is formed. In the central portion of the lower surface of the insulating layer 1a for the core, a recess 8 is formed. Each of these recesses 7 and 8 is formed, for example, by the blast processing and the laser processing.

The first capacitor 5 is placed in the recess 7. Then, the insulating layer 1b for the build-up is laminated on the upper surface of the insulating layer 1a for the core in such a manner as to fill the gap between the recess 7 and the first capacitor 5, whereby the first capacitor 5 is fixed in the recess 7.

The second capacitor 6 is placed in the recess 8. Then, the insulating layer 1b for the build-up is laminated on the lower surface of the insulating layer 1a for the core in such a manner as to fill the gap between the recess 8 and the second capacitor 6, whereby the second capacitor 6 is fixed in the recess 8.

The insulating board 1 includes a plurality of via holes 9 with the electrode 5t of the first capacitor as the bottom surface on its upper side. The insulating board 1 includes a plurality of via holes 10 with the electrode 6t of the second capacitor as the bottom surface on its lower side. The via holes 9 and 10 have a diameter of about 20 to 100 μm, and are formed, for example, by laser processing.

The insulating board 1 has a plurality of through holes 11 penetrating through the top and bottom. The diameter of the through holes 11 is about 50 to 300 μm, and is formed by, for example, drilling processing.

The circuit conductor 2 is formed on the upper and lower surfaces of the insulating board 1, in the via holes 9 and 10, and in the through holes 11. The circuit conductor 2 formed in the via holes 9 is connected to the electrode 5t of the first capacitor. The circuit conductor 2 formed in the via holes 10 is connected to the electrode 6t of the second capacitor.

The circuit conductor 2 formed in the through holes 11 electrically connects between the circuit conductors 2 on the upper and lower surfaces of the insulating board 1.

The circuit conductor 2 is formed of a highly conductive metal such as copper plating, for example, by the well-known semi-additive method or subtractive method.

The semiconductor element connection pad 3 includes a part of the circuit conductor 2 formed on the upper surface of the insulating board 1. The semiconductor element connection pad 3 is exposed to the inside of the opening 12a provided in the solder resist layer 12 deposited on the upper surface of the insulating board 1.

The external connection pad 4 includes a part of the circuit conductor 2 formed on the lower surface of the insulating board 1. The external connection pad 4 is exposed to the inside of the opening 12b provided in the solder resist layer 12 deposited on the lower surface of the insulating board 1.

The semiconductor element S includes, for example, a microprocessor and a semiconductor memory, and is formed from silicon and germanium. The electrode of the semiconductor element S is connected to the semiconductor element connection pad 3 through, for example, the solder bump B.

The first capacitor 5 and the second capacitor 6 are formed by alternate laminating of a dielectric containing, for example, a ceramic and an electrode containing copper. The first and second capacitors 5 and 6 respectively include electrodes 5t and 6t in two places of the outermost layer.

The capacity of the second capacitor 6 is larger than the capacity of the first capacitor 5, and can supply more current to the semiconductor element S. On the other hand, the internal inductance of the first capacitor 5 is smaller than the internal inductance of the second capacitor 6, which is advantageous to reducing the impedance of the current supply path.

The first capacitor 5 is electrically connected to the semiconductor element S through the first conductor path being connected to the semiconductor element connection pad 3 and including the circuit conductor 2 formed in the via holes 9.

The second capacitor 6 is electrically connected to the semiconductor element S through the second conductor path being connected to the semiconductor element connection pad 3 and including the circuit conductor 2 formed on the upper and lower surfaces of the insulating board 1, in the through holes 11, and in the via holes 10.

Thus, since the first conductor path length is shorter than the second conductor path length, the inductance of the first conductor path is smaller than the inductance of the second conductor path.

In the conventional semiconductor element mounting board including a plurality of conductor paths, for example, when the second conductor path length is longer than the first conductor path length, the inductance of the second conductor path sometimes becomes larger than the inductance of the first conductor path.

For this reason, when the magnitude relation between the internal inductance of the first capacitor 5 to be connected to the first conductor path and the internal inductance of the second capacitor 6 to be connected to the second conductor path is not considered, the impedance value of the conductor paths as a whole cannot be reduced, and the current fluctuation becomes large. As a result, it may become impossible to operate the electronic apparatus stably.

In contrast to this, the semiconductor element mounting board A of the present disclosure includes the first capacitor 5 whose internal inductance is less than that of the second capacitor 6, connected to the first conductor path with small inductance. This allows securing a path with a smaller inductance component and reducing the impedance value of the conductor paths as a whole.

Further, making the capacity of the second capacitor 6 to be connected to the second conductor path larger than the capacity of the first capacitor 5 allows the sum of the capacity of the first capacitor 5 and the capacity of the second capacitor 6 to be sufficiently large.

As a result, a lot of current with reduced current fluctuation can be supplied to the semiconductor element S. Therefore, a semiconductor element mounting board A capable of stably operating the electronic apparatus can be provided.

What is claimed is:

1. A semiconductor element mounting board comprising:
    an insulating board including a laminated structure where a plurality of insulating layers are laminated;
    a circuit conductor disposed on a surface and an inside of the insulating board;
    a plurality of semiconductor element connection pads disposed on the surface of the insulating board and connected to a part of the circuit conductor;
    a semiconductor element mounted on the surface of the insulating board through the semiconductor element connection pads;
    a first capacitor and a second capacitor that suppresses current fluctuation to the semiconductor element and are disposed on the surface or the inside of the insulating board;
    a first conductor path, including a part of the circuit conductor, that electrically connects the first capacitor to predetermined semiconductor element connection pads; and
    a second conductor path, including a part of the circuit conductor, that electrically connects the second capacitor to the predetermined semiconductor element connection pads in parallel with the first capacitor,
    wherein an inductance of the first conductor path is smaller than an inductance of the second conductor path, and
    wherein capacitance of the first capacitor is smaller than capacitance of the second capacitor, and wherein an internal inductance of the first capacitor is smaller than an internal inductance of the second capacitor.

2. The semiconductor element mounting board according to claim 1, wherein a length of the first conductor path is shorter than a length of the second conductor path.

\* \* \* \* \*